United States Patent [19]

McCollum

[11] Patent Number: 5,537,056
[45] Date of Patent: Jul. 16, 1996

[54] ANTIFUSE-BASED FPGA ARCHITECTURE WITHOUT HIGH-VOLTAGE ISOLATION TRANSISTORS

[75] Inventor: John L. McCollum, Saratoga, Calif.

[73] Assignee: Actel Corporation, Sunnyvale, Calif.

[21] Appl. No.: 316,022

[22] Filed: Sep. 30, 1994

[51] Int. Cl.$^6$ .................... H03K 19/173; H03K 19/00
[52] U.S. Cl. ................... 326/38; 326/41; 326/16
[58] Field of Search .................... 328/38, 41, 16

[56] References Cited

U.S. PATENT DOCUMENTS

| | | | |
|---|---|---|---|
| 4,829,203 | 5/1989 | Ashmore, Jr. | 326/38 |
| 4,855,619 | 8/1989 | Hsieh et al. | 326/41 |
| 4,896,296 | 1/1990 | Turner et al. | 365/189.08 |
| 5,045,726 | 9/1991 | Leung | 326/44 |
| 5,095,228 | 3/1992 | Galbraith | 326/38 |
| 5,166,557 | 11/1992 | Chen et al. | 326/38 |
| 5,341,030 | 8/1994 | Galbraith | 326/38 |
| 5,341,043 | 8/1994 | McCollum | 326/38 |
| 5,428,304 | 6/1995 | Landers et al. | 326/41 |

*Primary Examiner*—Edward P. Westin
*Assistant Examiner*—Richard Roseen
*Attorney, Agent, or Firm*—D'Alessandro & Ritchie

[57] ABSTRACT

A programmable interface for selectively making connections between an output node of a logic module and an interconnection array in a field programmable gate array integrated circuit includes a first antifuse having a first electrode electrically connected to the output node and a second electrode connected to the first electrode of a second a second antifuse. The second electrode or the second antifuse is connected to the interconnection array. A high-voltage transistor, capable of withstanding programming voltages used in the integrated circuit to program the antifuses, is connected between the common connection comprising the second electrode of the first antifuse and the first electrode of the second antifuse and a fixed voltage potential such as ground. A control element of the high-voltage transistor is connected to circuitry for programming antifuses.

4 Claims, 3 Drawing Sheets

5,537,056

ANTIFUSE-BASED FPGA ARCHITECTURE WITHOUT HIGH-VOLTAGE ISOLATION TRANSISTORS

BACKGROUND OF THE INVENTION

1. Field of the Invention

The present invention relates to antifuse-based field programmable gate array architectures. More particularly, the present invention relates to an antifuse-based field programmable gate array architecture which does not require the use of high-voltage isolation transistors to protect the outputs of logic function modules from the effects of high programming voltages used to program the antifuses in the interconnection arrays of such architectures.

2. The Prior Art

Antifuse-based field programmable gate array (FPGA) products include a plurality of logic function modules whose inputs and outputs are connectable to each other and to various I/O pads on the integrated circuit through an interconnect array of conductors by use of one-time programmable antifuse devices. The antifuses are programmed by placing a programming voltage across their two electrodes to disrupt a nonconducting antifuse layer disposed between the electrodes.

Antifuses are programmed at voltages that are higher than the logic transistors in the logic modules can tolerate without damage. In order to protect the transistors in the logic modules from these otherwise destructive programming voltages, the prior art has employed high-voltage isolation transistors disposed between the outputs of the logic function modules and the interconnection arrays.

While the high-voltage isolation transistors serve to protect the low-voltage transistors in the logic modules from destruction, they have the undesirable effect of adding a significant RC delay to the interconnection networks during normal operation of the programmed FPGA circuit after programming. In addition, a charge pump circuit must be disposed on the integrated circuit containing the FPGA in order to drive the gate of the high-voltage isolation transistor during normal circuit operation, thus adding layout and DC power overhead to the circuit design. Finally, the high-voltage isolation transistors add skew to the logic module outputs as their behavior is non-symmetrical between positive and negative transitions.

FPGA products designed by Actel Corporation, assignee of the present invention, have used one antifuse (referred to as an "F fuse") with no isolation transistor to connect logic modules to special conductive interconnect tracks, called "freeways", in the interconnect architecture. Use of "F fuse" devices complicates the device programming sequence, as the output of the module can only see one half the programming voltage. Because of this limitation, only a limited number of these "F fuse" antifuses can be used in such products. A portion of such an architecture is shown in U.S. Pat. No. 5,341,030.

It is an object of the present invention to provide an antifuse-based FPGA architecture which may be fabricated without the need for employing high-voltage isolation transistors.

It is a further object of the present invention to provide an antifuse-based FPGA architecture which has improved performance over prior-art antifuse-based FPGA architectures.

Yet another object of the present invention is to provide an antifuse-based FPGA architecture which may be implemented using currently-available technology.

BRIEF DESCRIPTION OF THE INVENTION

According to the present invention, an interface is provided between an output node of a logic module and an interconnection node. The interconnection node is connectable to one or more other circuit nodes via antifuses which are connected to the interconnection node. The interface comprises a first antifuse in series with a second antifuse. A high-voltage programming transistor, capable of withstanding programming voltages used to program the antifuses, is used to program the antifuse connected directly to the interconnection node and is connected between the circuit node common to the first and second antifuses and a fixed voltage potential such as ground. The high-voltage programming transistor is controlled by the programming circuitry which is used in the integrated circuit to control programming of the antifuses in the array.

Because the high-voltage isolation transistor is replaced by two antifuses in the logic signal path, the output capacitance and resistance of the logic module is thereby reduced. The key of course is that the on-resistance of each of the output antifuses is less than 50 ohms. This is superior to "F fuse" architecture in that it requires two antifuses to get to a freeway or net thus allowing the output inverter to only need to support Vcc and not Vpp/2. This allows even higher performance output devices to be used.

The output fuses are the last fuses programmed and Vpp would be applied through the programming circuitry and the ground applied by the output driver. The high-voltage programming transistor shown is used to provide the ground to program the first fuse to the net. Of course additional high voltage programming transistors can be added between the pair of antifuses for testing and biasing for programming by anyone skilled in the art. Also, additional high-voltage transistors can be added across each of the two fuses to test that the connections are there.

Another additional advantage of this scheme is that the low to high and the high to low transitions on the net will be symmetrical without an isolation device. Also there will be no need for a voltage pump to supply the bias for the isolation transistor thereby saving area and power.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
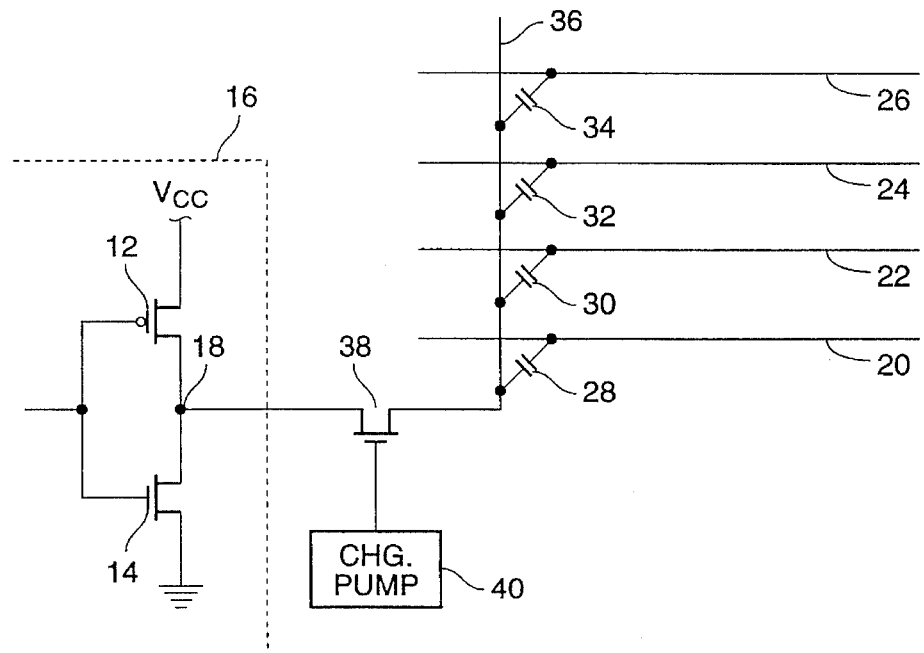
FIG. 1 is a schematic diagram showing a typical prior-art interface including a high-voltage isolation transistor between a logic module output and an interconnect architecture in an antifuse-based FPGA architecture.

An understanding of interfaces between logic modules and the interconnect architecture in typical prior-art antifuse-based FPGA architectures will facilitate an understanding of the present invention. Referring first to FIG. 1, a diagram is presented showing a typical prior-art interface including a high-voltage isolation transistor between a logic module output and an interconnect architecture in an antifuse-based FPGA architecture. A CMOS inverter comprising P-Channel MOS transistor 12 and N-Channel MOS transistor 14 in a typical logic function module 16 in an antifuse-based FPGA integrated circuit comprises its output node 18.

The output node 18 of the logic function module 16, comprising the common drain connection of P-Channel and N-Channel MOS transistors 12 and 14, is connectable to one of a plurality of general interconnect conductors, shown illustratively as interconnect conductors 20, 22, 24, and 26. The interconnect mechanism comprises antifuses 28, 30, 32, and 34 as is well known in the art. Persons of ordinary skill in the art will recognize that the interconnect architecture depicted in FIG. 1 is simplified for purposes of illustration and that actual FPGA products which embody such interconnect architectures will be more complex by varying degrees.

As will be appreciated by those of ordinary skill in the art, antifuses 28, 30, 32, and 34 may be programmed by applying one potential of a programming voltage Vpp to one of interconnect conductors 20, 22, 24, or 26, and the other potential of the Vpp programming voltage to the conductor 36. Circuitry for providing these potentials to the various interconnect conductors is known in the art, and is illustrated, for example, in U.S. Pat. No. 4,758,745 to El Gamal et al. A high-voltage isolation transistor 38 is placed in series with conductor 36 and the output node 18 of logic function module 16 to protect the low-voltage N-Channel MOS transistor 14 from the effects of the Vpp potential.

While high-voltage isolation transistor 38 protects the low-voltage P-Channel and N-Channel MOS transistors 12 and 14 in the output of the logic module 16 from destruction, it has the undesirable effect of adding a significant RC delay to the interconnection networks during normal operation of the programmed FPGA circuit. In addition, high-voltage isolation transistor 38 requires use of charge pump 40 to drive its gate to turn it on during normal use of the integrated circuit after programming. Charge pump 40 occupies additional layout area in the integrated circuit containing the FPGA. The elimination of charge pump 40 is one of the goals of the present invention.

Figure 2:
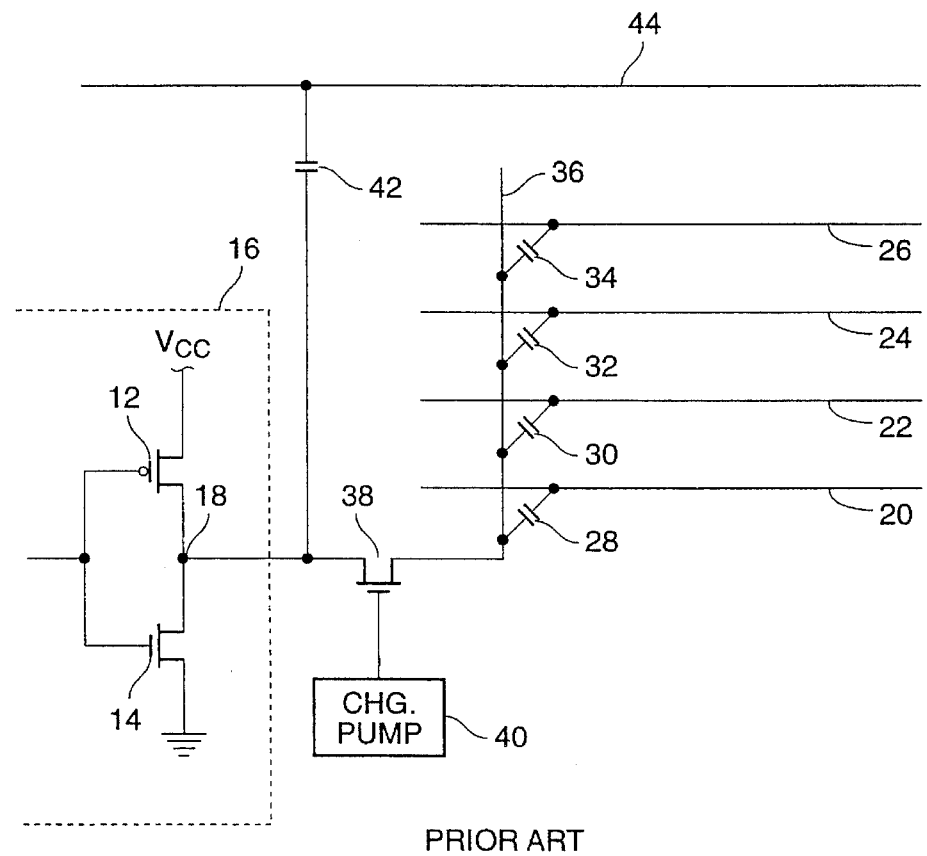
FIG. 2 is a schematic diagram showing another prior art interface in interconnect architecture in an antifuse-based FPGA architecture like that shown in FIG. 1 but further including a single antifuse between the logic module output and a specialized "freeway" interconnect conductor.

FIG. 2 is a diagram showing another prior art interface to interconnect architecture in an antifuse-based FPGA architecture. It is in most respects identical to the interface of FIG. 1, and therefore like elements are given like references numerals. In addition to the general interconnect structure of the interface of FIG. 1, the prior-art interface of FIG. 2 further including a single antifuse 42 between the logic module output node 18 of the logic function module 16 and a specialized "freeway" interconnect conductor 44. Antifuse 42 has been called an "F fuse" by Actel Corporation, assignee or the present invention.

As previously noted, use of "F fuse" antifuses complicates the device programming sequence, because the output node 18 of the logic function module 16 can only see one half the Vpp programming voltage. Because of this limitation, only a limited number of these "F fuse" antifuses can be used in such products.

The present invention is intended as a solution to the problems posed by the prior-art architectures illustrated in FIGS. 1 and 2.

Figure 3:
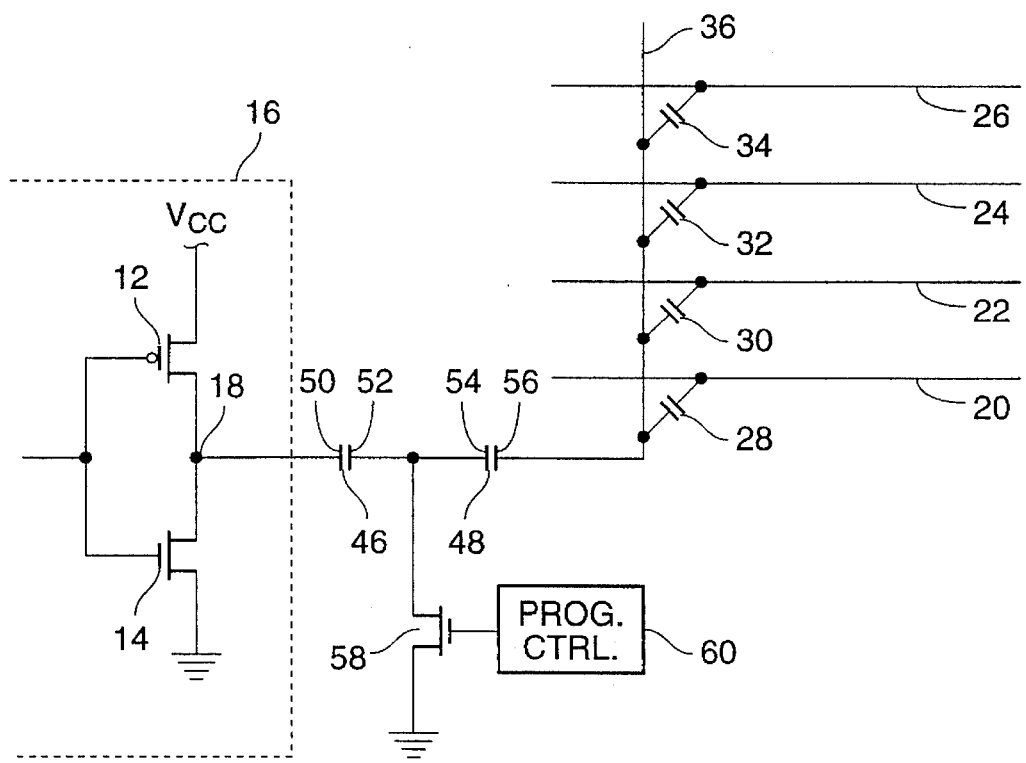
FIG. 3 is a schematic diagram showing the interface between a logic module output and an interconnect architecture in an antifuse-based FPGA architecture according to the present invention.

Referring now to FIG. 3, a diagram is presented showing the interface between a logic module output and an interconnect architecture in an antifuse-based FPGA architecture according to the present invention. As in the prior-art architectures depicted in FIGS. 1 and 2, a CMOS inverter comprising P-Channel MOS transistor 12 and N-Channel MOS transistor 14 forms the output node 18 of logic function module 16. Similarly, a simplified illustrative interconnect architecture is shown comprising interconnect conductors 20, 22, 24, and 26, which may be connected to conductor 36 via antifuses 28, 30, 32, and 34, respectively.

According to the present invention, conductor 36 is connected to the output node 18 of logic function module 16 through a first antifuse 46 in series with a second antifuse 48. The first electrode 50 of first antifuse 46 is electrically connected to output node 18 of logic function module 16 and second electrode 52 of first antifuse 46 is electrically connected to the first electrode 54 of second antifuse 48. The second electrode 56 of second antifuse 48 is electrically connected to the conductor 36.

A high-voltage programming transistor 58 is connected between the common connection of the second electrode 52 of first antifuse 46 and the first electrode 54 of second antifuse 48 and a fixed voltage potential such as ground. High-voltage programming transistor 58 is used to provide the ground potential for programming second antifuse 48. The ground potential for programming first antifuse 46 is provided by turning on N-Channel MOS transistor 14 in the output inverter of the logic function module 16. High-voltage programming transistor 58 is controlled by programming circuitry 60 connected to its gate. The structure and operation of such programming circuitry 60 is conventional and details will be omitted here in order to avoid unnecessarily overcomplicating the disclosure.

Those of ordinary skill in the art will recognize that high-voltage programming transistor 58 is outside of the signal path which will exist after programming of the FPGA device containing this circuitry. This provides a significant advantage in that the RC delay associated with the high-voltage isolation transistor 38 of the prior-art embodiments of FIGS. 1 and 2 is eliminated. If the on-resistance of the high-voltage isolation transistor 38 is reasonably assumed to be 100 ohms, and the programmed resistance of each of the first and second antifuses 46 and 48 is assumed to be less than 50 ohms, those of ordinary skill in the art will appreciate that the elimination of the gate capacitance of high-voltage isolation transistor 38 provides a significant reduction in the RC time delay at the output node 18 of the logic module 16.

Also, because the high-voltage programming transistor 58 is turned on only during the programming cycle, when the Vpp programming voltage is supplied to the integrated circuit from off-chip, there is no need to provide charge pump 40, which was necessary to maintain high-voltage isolation transistor 38 in its "on" state during the normal functioning of the integrated circuit containing the FPGA when no high voltage such as Vpp is presented to the integrated circuit.

The absence of a high-voltage isolation transistor 38 from the signal path at the output node 18 of logic function module provides an additional advantage. The presence or such a transistor creates a skew between the performance of the circuit during logic zero to logic one transitions and during logic one to logic zero transitions of the output of logic function module 16 due to the difference in gate drive of the high-voltage isolation transistor 38. Without high voltage isolation transistor 38 in the signal path and only two passive devices, first and second antifuses 46 and 48 in the signal path, the performance of the circuit will be symmetrical for both positive and negative going logic transitions. This performance difference will be most beneficial at high operating frequencies.

Figure 4:
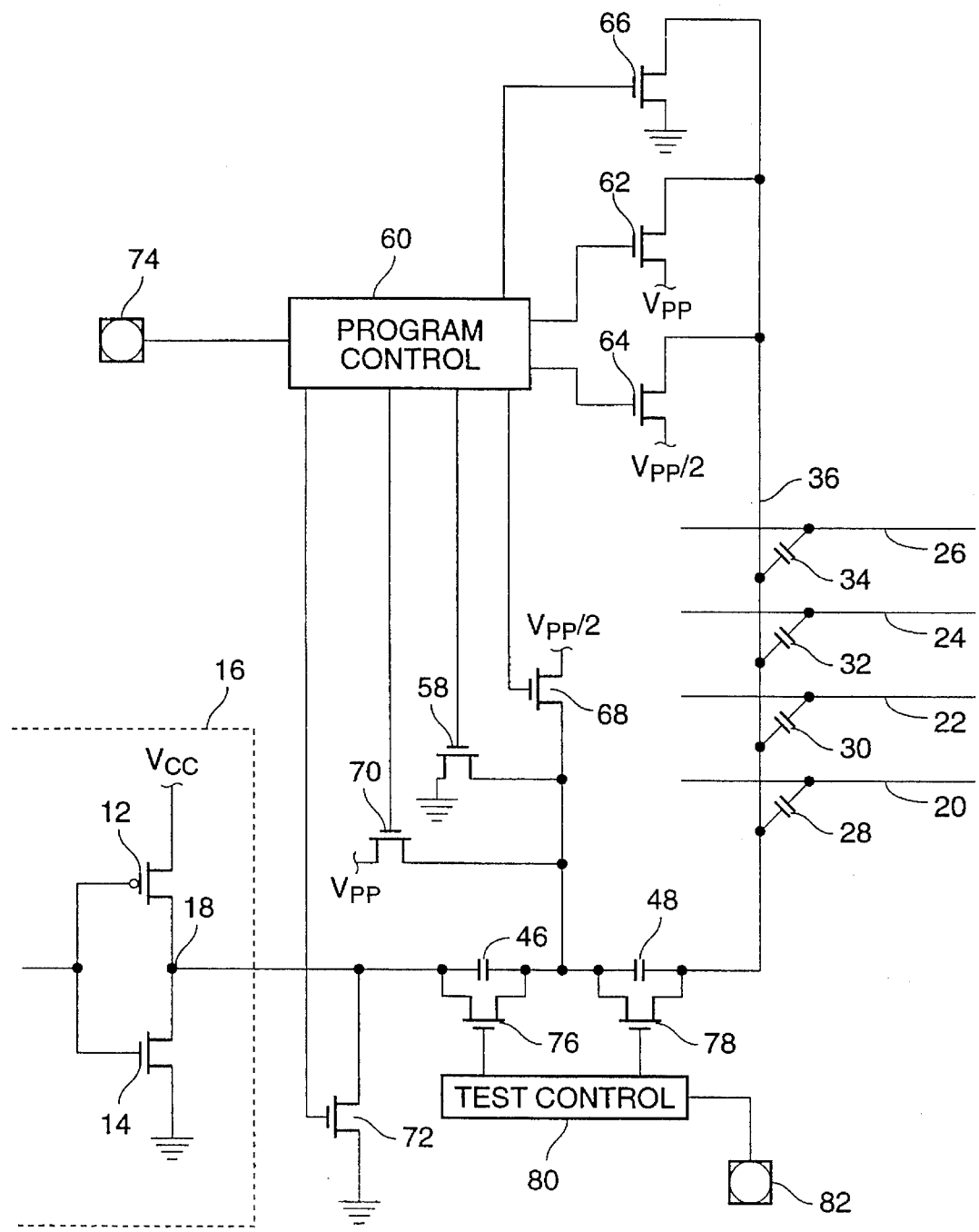
FIG. 4 is a schematic diagram showing the interface of FIG. 3 and additionally including a plurality of control transistors for programming and testing functions.

Referring now to FIG. 4, a more detailed schematic diagram shows an illustrative environment in which the interface of the present invention may be employed. As will be appreciated by persons of ordinary skill in the art, circuits for testing and programming antifuses and architectures containing antifuses are included in actual FPGA products. FIG. 4 illustrates several possible programming and testing schemes which may be employed with the interface of the present invention.

FIG. 4 shows the output inverter containing P-Channel and N-Channel MOS transistors 12 and 14 and the output node 18 of logic function module 16, the first and second antifuses 46 and 48, and high-voltage programming transistor 58 as in FIG. 3. The conductor 36 is connectable to interconnect conductors 20, 22, 24, and 26 via antifuses 28, 30, 32, and 34, respectively.

In addition, several other devices and circuits are present in FIG. 4 and are useful to provide additional programming and testing functions. These devices are used to implement functions associated with programming and testing of the integrated circuit.

First, with respect to programming of the integrated circuit containing the interface of the present invention. N-Channel MOS transistors 62, 64, and 66 are connected between conductor 36 and Vpp, Vpp/2 and ground, respectively. The gates of N-Channel MOS transistors 62, 64, and 66 are controlled by programming circuitry 60. N-Channel MOS transistors 62, 64, and 66 allow placing any one of the potentials Vpp, Vpp/2 or ground on conductor 36 during the programming process as is well understood in the art. N-Channel MOS transistors 68 and 70 are connected between the common connection of first and second antifuses 46 and 48 and Vpp/2 and Vpp, respectively. The gates of N-Channel MOS transistors 68 and 70 are also controlled by programming circuitry 60 and allow placing one of the potentials Vpp/2 and Vpp on the common connection of first and second antifuses 46 and 48 during the programming process as is well understood in the art. Finally, N-Channel MOS transistor 72 is connected between the output node 18 of logic function module 16 and ground. Its gate is driven from programming circuitry 60. This transistor is optional and allows soaking of antifuses 46 and 48 during the programming cycle as is known in the art.

Programming circuitry 60 is controlled from off-chip in a manner well known in the art by entering data identifying which antifuses are to be programmed. I/O pad 74 is shown communicating with programming circuitry 60, but those of ordinary skill in the art will recognize that the number of I/O pads actually used will depend on the particular design of an individual integrated circuit.

N-Channel MOS transistors 76 and 78 are connected across first and second antifuses 46 and 48, respectively. These transistors are used for testing the integrated circuit by temporarily selectively shorting out antifuses 46 and 48 prior to programming of the integrated circuit. The gates of N-Channel MOS transistors 76 and 78 are controlled from test control circuit 80. Test control circuit 80 is controlled from off-chip in a manner well known in the art by entering data identifying tests to be made. I/O pad 82 is shown communicating with test control circuit 80. Those of ordinary skill in the art will recognize that the number of I/O pads actually used will depend on the particular design of an individual integrated circuit. Such skilled persons will also understand that the test control circuitry 80 may be combined with the programming circuitry 60.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. In a field programmable gate array integrated circuit including a plurality of logic modules and an interconnection array, a programmable interface for selectively making connections between an output node of a logic module and an interconnection node in said interconnection array, comprising:

a first antifuse having a first electrode and a second electrode, said first electrode electrically connected to the output node;

a second antifuse having a first electrode and a second electrode, said first electrode electrically connected to said second electrode of said first antifuse and said second electrode connected to the interconnection array; and a high-voltage transistor, capable of withstanding programming used in the integrated circuit to program the antifuses, connected between the common connection comprising said second electrode of said first antifuse and said first electrode of said second antifuse and a fixed voltage potential such as ground, said high-voltage transistor having a control element connected to circuitry for programming antifuses located on said integrated circuit.

2. The programmable interface of claim 1, further including a programming-inhibit transistor connected between a common connection comprising said second electrode of said first antifuse and said first electrode of said second antifuse and a fixed voltage potential of about Vpp/2, said programming-inhibit transistor having a control element connected to said circuitry for programming antifuses.

3. The programmable interface of claim 1, further including a programming transistor connected between the common connection comprising said second electrode of said first antifuse and said first electrode of said second antifuse and a fixed voltage potential of about Vpp, said programming transistor having a control element connected to said circuitry for programming antifuses.

4. The programmable interface of claim 1, further including a first test transistor connected across said first antifuse and a second test transistor connected across said second antifuse, said first and second test transistors having control electrodes connected to test control circuitry.

* * * * *

UNITED STATES PATENT AND TRADEMARK OFFICE
CERTIFICATE OF CORRECTION

PATENT NO. : 5,537,056
DATED : July 16, 1996
INVENTOR(S) : John L. McCollum

It is certified that error appears in the above-indentified patent and that said Letters Patent is hereby corrected as shown below:

Column 3, line 60, replace "or" with --of--.
Column 3, line 64, after "half" insert --of--.
Column 4, line 64, after "function" insert --16--.
Column 5, line 5, after "48" insert --,--.

Signed and Sealed this

Twenty-fourth Day of December, 1996

Attest:

BRUCE LEHMAN

Attesting Officer      Commissioner of Patents and Trademarks